(12) United States Patent
Chen et al.

(10) Patent No.: US 11,989,968 B2
(45) Date of Patent: May 21, 2024

(54) FINGERPRINT SENSING SYSTEM WITH CURRENT CONTROL

(71) Applicant: FINGERPRINT CARDS ANACATUM IP AB, Gothenburg (SE)

(72) Inventors: Ping-Liang Chen, Hsinchu (TW); Andreas Larsson, Herrljunga (SE)

(73) Assignee: FINGERPRINT CARDS ANACATUM IP AB, Gothenburg (SE)

( * ) Notice: Subject to any disclaimer, the term of this patent is extended or adjusted under 35 U.S.C. 154(b) by 0 days.

(21) Appl. No.: 18/259,290

(22) PCT Filed: Feb. 8, 2022

(86) PCT No.: PCT/SE2022/050136
§ 371 (c)(1),
(2) Date: Jun. 26, 2023

(87) PCT Pub. No.: WO2022/173351
PCT Pub. Date: Aug. 18, 2022

(65) Prior Publication Data
US 2024/0062574 A1 Feb. 22, 2024

(30) Foreign Application Priority Data

Feb. 12, 2021 (SE) .................................. 2150153-1

(51) Int. Cl.
*G06V 40/13* (2022.01)
*G11C 11/419* (2006.01)

(52) U.S. Cl.
CPC ........ *G06V 40/1306* (2022.01); *G11C 11/419* (2013.01)

(58) Field of Classification Search
CPC .......................... G06V 40/1306; G11C 11/419
See application file for complete search history.

(56) References Cited

U.S. PATENT DOCUMENTS 11,093,090 B2  8/2021  Larsson et al.
11,854,296 B2 * 12/2023  Larsson ............. G06V 40/1365
(Continued)

FOREIGN PATENT DOCUMENTS

CN  112287747 A  1/2021
WO  2017003848 A1  1/2017
(Continued)

OTHER PUBLICATIONS

International Search Report and Written Opinion for International Application No. PCT/SE2022/050136, dated Mar. 23, 2022.

*Primary Examiner* — Michael Pervan
(74) *Attorney, Agent, or Firm* — Westman, Champlin & Koehler, P.A.

(57) ABSTRACT

A fingerprint sensing system comprising a plurality of conductive selection lines; a plurality of conductive read-out lines crossing the selection lines; selection circuitry controllable to provide a selection signal on at least one selected selection line in the plurality of selection lines; a plurality of pixel elements formed at intersections between the selection lines and the read-out lines; current providing circuitry coupled to the read-out lines and controllable to generate a current pulse in at least one of the read-out lines when reading out a sensing signal from each of the pixel elements.

14 Claims, 5 Drawing Sheets

(56) References Cited

U.S. PATENT DOCUMENTS

| | | |
|---|---|---|
| 2005/0176194 A1 | 8/2005 | Sasaki et al. |
| 2017/0006245 A1 | 1/2017 | Akhavan Fomani et al. |
| 2017/0046555 A1 | 2/2017 | Lee |
| 2017/0277931 A1 | 9/2017 | Uehara et al. |
| 2017/0351364 A1 | 12/2017 | Kim et al. |
| 2018/0101271 A1 | 4/2018 | Tsai et al. |
| 2019/0012504 A1 | 1/2019 | Kim et al. |
| 2020/0012833 A1 | 1/2020 | Jin et al. |
| 2020/0142534 A1 | 5/2020 | Gu et al. |
| 2021/0173501 A1* | 6/2021 | Larsson ................ G06F 3/0418 |
| 2023/0090292 A1* | 3/2023 | Larsson ............. G06V 40/1365 |
| | | 382/124 |
| 2023/0169787 A1* | 6/2023 | Larsson ............. G06V 40/1318 |
| | | 382/124 |

FOREIGN PATENT DOCUMENTS

| | | |
|---|---|---|
| WO | 2019037098 A1 | 2/2019 |
| WO | 2020004781 A1 | 1/2020 |
| WO | 2021112742 A1 | 6/2021 |

* cited by examiner

FINGERPRINT SENSING SYSTEM WITH CURRENT CONTROL

CROSS-REFERENCE TO RELATED APPLICATION

This Application is a Section 371 National Stage Application of International Application No. PCT/SE2022/050136, filed Feb. 8, 2022, which claims priority to Swedish Patent Application No. 2150153-1 filed on Feb. 12, 2021, and published as WO 2022/173351 A1 on Aug. 18, 2022, in English, the entire contents of which are hereby incorporated by reference in their entireties.

FIELD OF THE INVENTION

The present invention relates to a fingerprint sensing system for sensing a finger surface of a finger, comprising a plurality of conductive selection lines arranged in parallel to each other; a plurality of conductive read-out lines arranged in parallel to each other and crossing the selection lines; selection circuitry coupled to each selection line in the plurality of selection lines, and controllable to provide a selection signal on at least one selected selection line in the plurality of selection lines; and a plurality of pixel elements, each being formed at a respective intersection between a selection line in the plurality of selection lines and a read-out line in the plurality of read-out lines.

BACKGROUND OF THE INVENTION

Fingerprint sensing systems are widely used as means for increasing the convenience and security of electronic devices, such as mobile phones etc. In various electronic devices having a display, it may be desirable to provide for fingerprint sensing within the area occupied by the display. It may also be desirable to provide for fingerprint sensing across a relatively large area of the display.

A suitable configuration for a fingerprint sensing system for this and other applications may be a fingerprint system having a configuration with a plurality of conductive selection lines arranged in parallel to each other; a plurality of conductive read-out lines arranged in parallel to each other and crossing the selection lines; selection circuitry coupled to each selection line in the plurality of selection lines, and controllable to provide a selection signal on at least one selected selection line in the plurality of selection lines; and a plurality of pixel elements, each being formed at a respective intersection between a selection line in the plurality of selection lines and a read-out line in the plurality of read-out lines.

This sensor configuration can be at least partly realized using relatively cost-efficient materials and technologies, such as TFT (thin film transistor) technology on a glass or plastic substrate. Therefore, this sensor configuration may provide for reduced cost per unit surface area compared to existing fingerprint sensors. It would, however, be desirable to decrease the time needed to acquire a fingerprint representation (such as a fingerprint image) with this type of sensor.

SUMMARY

It is an object of the present invention to provide an improved fingerprint sensing system, in particular a fingerprint sensing system providing for a reduction in the time needed to acquire a fingerprint representation.

According to a first aspect of the present invention, it is therefore provided a fingerprint sensing system for sensing a finger surface of a finger, comprising: a plurality of conductive selection lines arranged in parallel to each other; a plurality of conductive read-out lines arranged in parallel to each other and crossing the selection lines; selection circuitry coupled to each selection line in the plurality of selection lines, and controllable to provide a selection signal on at least one selected selection line in the plurality of selection lines; current providing circuitry coupled to the read-out lines and controllable to generate a current in at least one of the read-out lines; and a plurality of pixel elements, each being formed at a respective intersection between a selection line in the plurality of selection lines and a read-out line in the plurality of read-out lines, each pixel element in the plurality of pixel elements comprising: a sensing element responsive to a property indicative of a distance between the sensing element and the finger surface to provide an output indicating a sensed value of the property; and a sensing signal providing element coupled to the sensing element, the selection line and the read-out line, the sensing signal providing element being configured to, in response to the selection signal being provided on the selection line, control the potential on the read-out line to a sensing potential being dependent on the output provided by the sensing element, wherein the fingerprint sensing system further comprises: operation control circuitry coupled to the selection circuitry and to the controllable current providing circuitry, and configured to, for each pixel element in the plurality of pixel elements: provide a first control signal to the selection circuitry for controlling the selection circuitry to provide the selection signal on the selection line coupled to the sensing signal providing element of the pixel element; and provide a second control signal to the current providing circuitry to generate a current in the read-out line coupled to the sensing signal providing element of the pixel element.

The sensing element may be responsive to a physical property that differs in dependence on the topography of the finger surface. Examples of such physical properties include capacitive coupling, mechanical coupling, thermal coupling, and optical reflection. As is well known to those of ordinary skill in the art, various sensing element configurations exist, that are suitable for sensing these physical properties indicative of the interaction between the finger and the sensing element. In the case of capacitive coupling, the sensing element may, for example, include a conductive plate where charge can be accumulated; in the case of mechanical coupling, the sensing element may, for example, have piezo-electric properties; in the case of thermal coupling, the sensing element may, for example, include a resistor or other circuit element that can be controlled to generate heat; and in the case of optical reflection, the sensing element may, for example, include a photo-diode that generates a photocurrent indicative of an amount of incident light.

The fingerprint sensing system according to embodiments of the present invention may advantageously be implemented using TFT-technology, providing for a cost-efficient fingerprint sensing system exhibiting a large sensing area.

The present invention is based on the realization that the driving capability of the sensing signal providing element, which is present in every pixel element, can be a limiting factor for the read-out time/speed of the fingerprint sensing system, and that time required to control the read-out line to the sensing potential can be reduced by generating a current in the read-out line using current providing circuitry external to the pixel element when selecting the pixel element using the selection circuitry.

The driving capability that can be designed into the sensing signal providing element is mainly restricted by the limited surface area available for the pixel element comprising the sensing signal providing element. In embodiments of the fingerprint sensing system according to the present invention, the driving capability of the sensing signal providing element of a presently selected pixel element can be temporarily supplemented with the driving capability of controllable current providing circuitry that is external to the pixel element, and thus not restricted to the same limited surface area.

In various embodiments, the sensing signal providing element may comprise a field-effect transistor coupled to the sensing element and to the read-out line. In such embodiments, the current generated by the current providing circuitry in response to the second control signal may work as a bias for the field-effect transistor. In addition to increasing the speed of the sensing signal providing element, the current generated by the current providing circuitry may also improve the linearity.

The field-effect transistor may advantageously be coupled in a common source amplifier configuration or a common drain amplifier (also referred to as source follower) configuration.

In various embodiments, the fingerprint sensing system according to the present invention may further comprise pre-charge potential providing circuitry coupled to the read-out lines and controllable to charge at least one of the read-out lines to a predefined pre-charge potential. The operation control circuitry may be coupled to the pre-charge potential providing circuitry and configured to, for each pixel element in the plurality of pixel elements, provide a third control signal to the pre-charge potential providing circuitry to control the read-out line coupled to the sensing signal providing element of the pixel element to the pre-charge potential.

This third control signal may advantageously be provided before the first control signal and the second control signal.

By pre-charging the read-out line to a suitable potential, the read-out time can be reduced even further, since the amount of charge that needs to be provided by the sensing signal providing element to arrive at the sensing potential can be reduced. The sensing potential is an indication of the distance between the sensing element of the pixel element and the finger surface.

The sensing signal providing element may be capable of controlling the potential on the read-out line to sensing potentials within a predefined sensing potential range, and the suitable potential to which the read-out line may be pre-charged by the pre-charge potential providing circuitry may advantageously be related to the predefined sensing potential range.

In embodiments, the pre-charge potential may be outside the sensing potential range, higher than 70% of the minimum sensing potential, and lower than 130% of the maximum sensing potential.

When the pre-charge potential is lower than the minimum sensing potential, the sensing signal providing element may be configured to control the potential on the read-out line to the sensing potential being dependent on the output provided by the sensing element by increasing the potential on the read-out line.

When the pre-charge potential is higher than the maximum sensing potential, the sensing signal providing element may be configured to control the potential on the read-out line to the sensing potential being dependent on the output provided by the sensing element by decreasing the potential on the read-out line.

According to embodiments, the sensing element comprised in each pixel element in the plurality of pixel elements may be responsive to an amount of light incident on the sensing element to provide an output indicating a sensed value of the amount of light.

The fingerprint sensing system according to embodiments of the present invention may be included in an electronic device further comprising processing circuitry coupled to the fingerprint sensing system, and configured to perform an authentication based on the read-out signals provided by the read-out circuitry of the fingerprint sensing system.

According to a second aspect of the present invention, it is provided a method of operating a fingerprint sensing system comprising a plurality of conductive selection lines arranged in parallel to each other; a plurality of conductive read-out lines arranged in parallel to each other and crossing the selection lines; selection circuitry coupled to each selection line in the plurality of selection lines; current providing circuitry coupled to the read-out lines; and a plurality of pixel elements, each being formed at a respective intersection between a selection line in the plurality of selection lines and a read-out line in the plurality of read-out lines, each pixel element in the plurality of pixel elements comprising: a sensing element responsive to a property indicative of a distance between the sensing element and the finger surface to provide an output indicating a sensed value of the property; and a sensing signal providing element coupled to the sensing element, the selection line and the read-out line, the method comprising, for each pixel element in the plurality of pixel elements: a) controlling the selection circuitry to provide the selection signal on the selection line coupled to the sensing signal providing element of the pixel element; and b) controlling the current providing circuitry to generate a current in the read-out line coupled to the sensing signal providing element of the pixel element.

In summary, the present invention thus relates to a fingerprint sensing system comprising a plurality of conductive selection lines; a plurality of conductive read-out lines crossing the selection lines; selection circuitry controllable to provide a selection signal on at least one selected selection line in the plurality of selection lines; a plurality of pixel elements formed at intersections between the selection lines and the read-out lines; and current providing circuitry coupled to the read-out lines and controllable to generate a current pulse in at least one of the read-out lines when reading out a sensing signal from each of the pixel elements.

BRIEF DESCRIPTION OF THE DRAWINGS

These and other aspects of the present invention will now be described in more detail, with reference to the appended drawings showing example embodiments of the invention, wherein.

DETAILED DESCRIPTION OF EXAMPLE EMBODIMENTS

In the present detailed description, various embodiments of the fingerprint sensing system according to the present invention are mainly described with reference to a fingerprint sensing system in which the sensing elements are light-sensitive pixel elements, capable of sensing differences in the amount of light hitting the different pixel elements. Furthermore, the fingerprint sensing system is mainly described as being arranged under a display panel. However, this should not be construed as limiting the present invention, as defined by the claims. According to embodiments, other types of pixel elements may be used, that may be responsive to other properties than light. Furthermore, the fingerprint sensing system need not be arranged under a display panel, but may be used in other configurations, such as under a cover glass plate or over a display panel etc.

Figure 1:
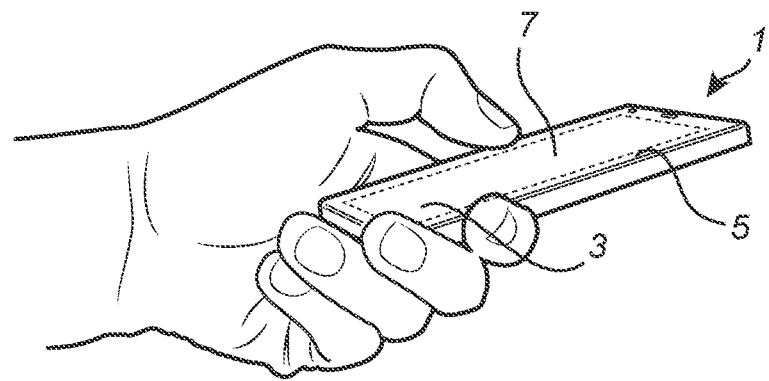
FIG. 1 is an illustration of an exemplary electronic device comprising a fingerprint sensing system according to an embodiment of the present invention, in the form of a mobile phone.

Turning now to the drawings and in particular to FIG. 1, there is schematically illustrated an example of an electronic device 1 configured to apply the concept according to the present disclosure, in the form of a mobile device with an integrated in-display fingerprint sensing system 3 and a display panel 5 with a touch screen interface 7. The fingerprint sensing system 3 may, for example, be used for unlocking the mobile device 1 and/or for authorizing transactions carried out using the mobile device 1, etc.

The fingerprint sensing system 3 is here shown to be smaller than the display panel 5, but still relatively large, e.g. a large area implementation, In another advantageous implementation the fingerprint sensing system 3 may be the same size as the display panel 5, i.e. a full display solution. Thus, in such case the user may place his/her finger anywhere on the display panel for biometric authentication. The fingerprint sensing system 3 may in other possible implementations be smaller than the depicted fingerprint sensing system, such as providing a hot-zone implementation.

Preferably and as is apparent to the skilled person, the mobile device 1 shown in FIG. 1 may further comprise a first antenna for WLAN/Wi-Fi communication, a second antenna for telecommunication communication, a microphone, a speaker, and a phone control unit. Further hardware elements are of course possibly comprised with the mobile device.

It should furthermore be noted that the invention may be applicable in relation to other types of electronic devices, such as smart watches, laptops, tablet computers, etc.

Figure 2:
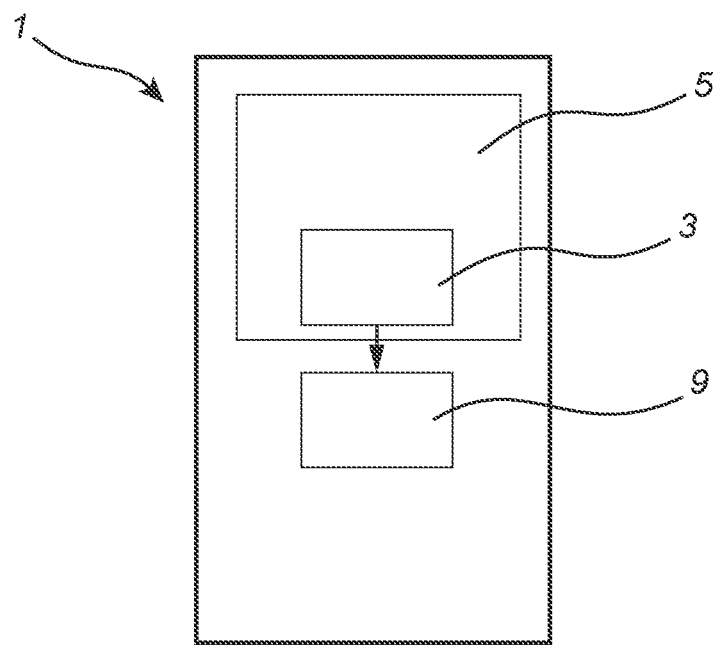
FIG. 2 is a schematic block diagram of the electronic device in FIG. 1.

FIG. 2 is a schematic block diagram of the electronic device 1 in FIG. 1. The electronic device 1 comprises a transparent display panel 5 and a fingerprint sensing system 3 conceptually illustrated to be arranged under the transparent display panel 5. Furthermore, the electronic device 1 comprises processing circuitry such as control unit 9 coupled to the fingerprint sensing system 3, and configured to perform an authentication based on read-out signals provided by the fingerprint sensing system 3. The control unit 9 may be stand-alone control unit of the electronic device 9, e.g. a device controller. Alternatively, the control unit 9 may be comprised in the fingerprint sensing system 3.

Figure 3:
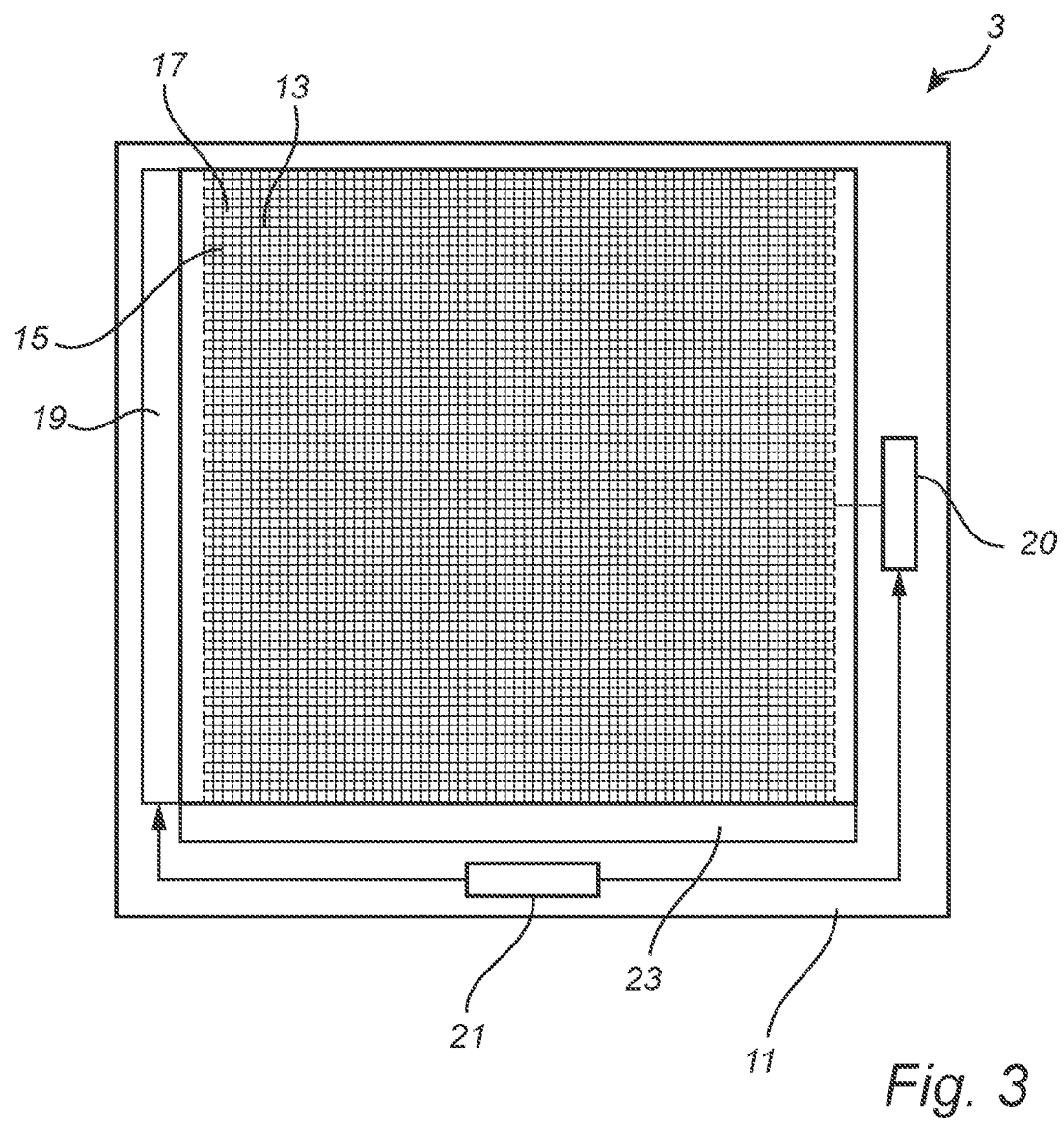
FIG. 3 schematically illustrates a fingerprint sensing system according to an example embodiment of the present invention.

A fingerprint sensing system 3 according to an example embodiment of the present invention will now be described with reference to FIG. 3. As is schematically indicated in FIG. 3, the fingerprint sensing system 3 comprises structures formed on a substrate or carrier 11. In particular in embodiments where the fingerprint sensing system 3 is primarily manufactured using TFT-techniques, which are per se known to those skilled in the art, the carrier 11 may advantageously be made of glass or plastic. On the substrate 11 are formed a plurality of conductive selection lines 13 and a plurality of conductive read-out lines 15. The selection lines 13 are arranged in parallel to each other, and the read-out lines 15 are arranged in parallel to each other and crossing the selection lines 13. The selection lines 13 are conductively separated from the read-out lines 15, typically by a dielectric layer deposited between a first conductive layer including the selection lines 13 and a second conductive layer including the read-out lines 15. A plurality of pixel elements 17, here forming a pixel element array, are formed at respective intersections between the selection lines 13 and the read-out lines 15. In addition to the selection lines 13 and the read-out lines 15, the fingerprint sensing system 3 according to the example embodiment in FIG. 3 comprises selection circuitry 19 coupled to each of the selection lines 13, current providing circuitry 20, and operation control circuitry 21. As is schematically indicated in FIG. 3, the current providing circuitry 20 is coupled to the read-out lines 15. As will be described in greater detail further below, the current providing circuitry 20 is controllable to generate a current in at least one of the read-out lines 15. The operation control circuitry 21 is coupled to the selection circuitry 19 and to the current providing circuitry 20 for controlling at least part of the operation of the fingerprint sensing system 3. Although the current providing circuitry 20 and the operation control circuitry 21 are schematically indicated in FIG. 3 as being provided on the substrate 11, it should be noted that the functionality thereof may be fully or partly provided by external circuitry, which may be implemented in the form of an ASIC or other circuitry. In addition to what has been introduced above, the example embodiment of the fingerprint sensing system 3 in FIG. 3 comprises read-out circuitry 23 coupled to each read-out line 15 in the plurality of read-out lines for acquiring sensing signals from the pixel elements 17.

Figure 4:
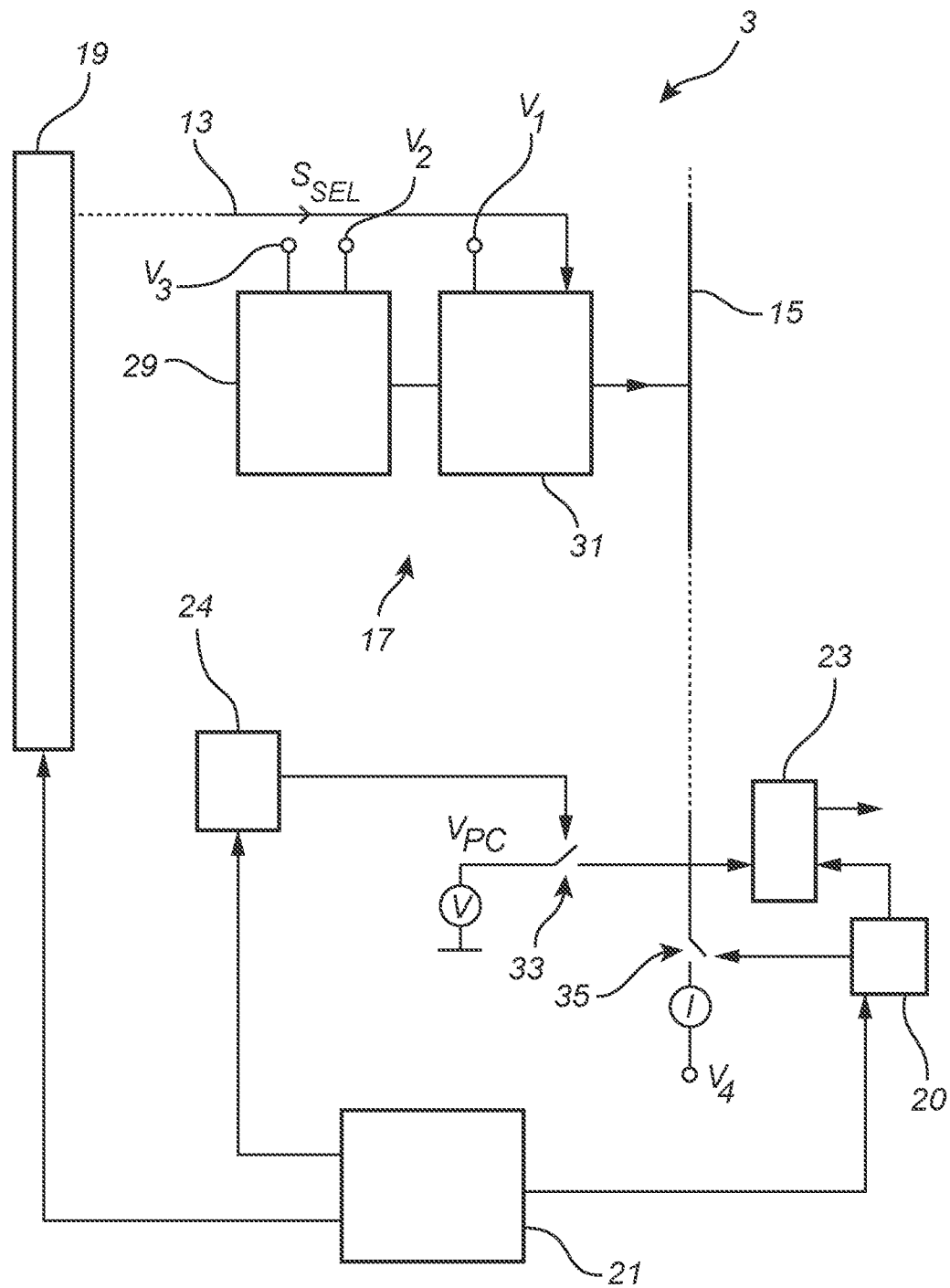
FIG. 4 is a more detailed functional illustration of the fingerprint sensing system in FIG. 3.

Various functional elements of the fingerprint sensing system in FIG. 3 will now be described with reference to FIG. 4. FIG. 4 is a schematic functional illustration of the fingerprint sensing system 3 in which a pixel element 17 comprised in the fingerprint sensing system 3 and the read-out line 15 coupled to the pixel element 17 are shown in greater detail.

Referring to FIG. 4, the pixel element 17 comprises a sensing element 29 and a sensing signal providing element 31. The sensing element 29 is responsive to a property indicative of a distance between the sensing element 29 and the finger surface, to provide an output indicating a sensed value of the property. In the exemplary configuration in FIG. 4, the output may suitably be a current or a voltage, that indicates the sensed value of the property. As is schematically indicated in FIG. 4, the sensing signal providing element 31 is coupled to the sensing element 29, the selection line 13, and the read-out line 15. In response to a selection signal $S_{SEL}$ provided by the selection circuitry 19 on the selection line 13 to which the sensing signal providing element 31 is connected, the sensing signal providing element 31 is configured to control the potential on the read-out line 15 to a sensing potential $V_{PX}$ that is dependent on the output provided by the sensing element 29.

As was mentioned above with reference to FIG. 3, the fingerprint sensing system 3 further comprises operation control circuitry 21, that is coupled to the selection circuitry 19 and to the current providing circuitry 20. As is schematically indicated in FIG. 4, the fingerprint sensing system 3 may optionally further include pre-charge potential providing circuitry 24, and the operation control circuitry 21 may additionally be coupled to the pre-charge potential providing circuitry 24.

The operation control circuitry 20 may also be coupled to the read-out circuitry 23 for determining a sampling timing for sampling the potential on the read-out line 15.

As is schematically indicated in FIG. 3, the fingerprint sensing system 3 may have a number of different reference potentials. In FIG. 3, the sensing signal providing element 31 may be provided with a first reference potential $V_1$, the sensing element may be provided with a second reference potential $V_2$ and a third reference potential $V_3$, the read-out line 15 may be terminated by a fourth reference potential $V_4$, and the optional pre-charge potential $V_{pc}$ may be suitably selected to be relatively close to the sensing potential range accessible by the sensing signal providing element 31. This sensing potential range is mainly determined by the reference potentials $V_1$, $V_2$, $V_3$ provided to the pixel element 17, but may differ depending on the particular pixel element design. When the design is set, this sensing potential range will be straight-forward for the skilled person to determine, for example using standard circuit simulation techniques.

With additional reference to the exemplary timing diagram in FIG. 5, a somewhat simplified and idealized operation of the fingerprint sensing system 3 under control of the operation control circuitry 21 will now be described.

The procedure for acquiring a sensing value from a pixel element 17 may optionally start by providing, by the operation control circuitry 21, a pre-charging control signal to the pre-charge potential providing circuitry 24. The pre-charging control signal may be provided during a predefined pre-charging time duration $T_{pc}$ for changing the potential of the read-out line 15 to the pre-charge potential $V_{pc}$, for example by closing the pre-charge switch 33 in FIG. 4 during the pre-charging time duration $T_{pc}$. The pre-charge potential $V_{pc}$ may be relatively close to the above-mentioned sensing potential range, which may contribute to reducing the time needed for signal acquisition and reducing the occurrence of spikes in the supply current to the fingerprint sensing system 3, as compared to the situation where the potential of the read-out line 15 is reset to ground or to $V_4$.

After having controlled the read-out line 15 to the pre-charge potential $V_{pc}$, in embodiments where this is included, the operation control circuitry 21 controls the selection circuitry 19 to provide the above-mentioned selection signal $S_{sel}$ to the selection line 13 coupled to the sensing signal providing element 31 during a selection time duration $T_{sel}$. The operation control circuitry 21 also controls the current providing circuitry 20 to generate a current in the read-out line 15 during a current pulse time duration $T_{cp}$, resulting in the current pulse 34 indicated in FIG. 5. This may, for example, be achieved by closing the current source switch 35 in FIG. 4 during the current pulse time duration $T_{cp}$.

Figure 5:
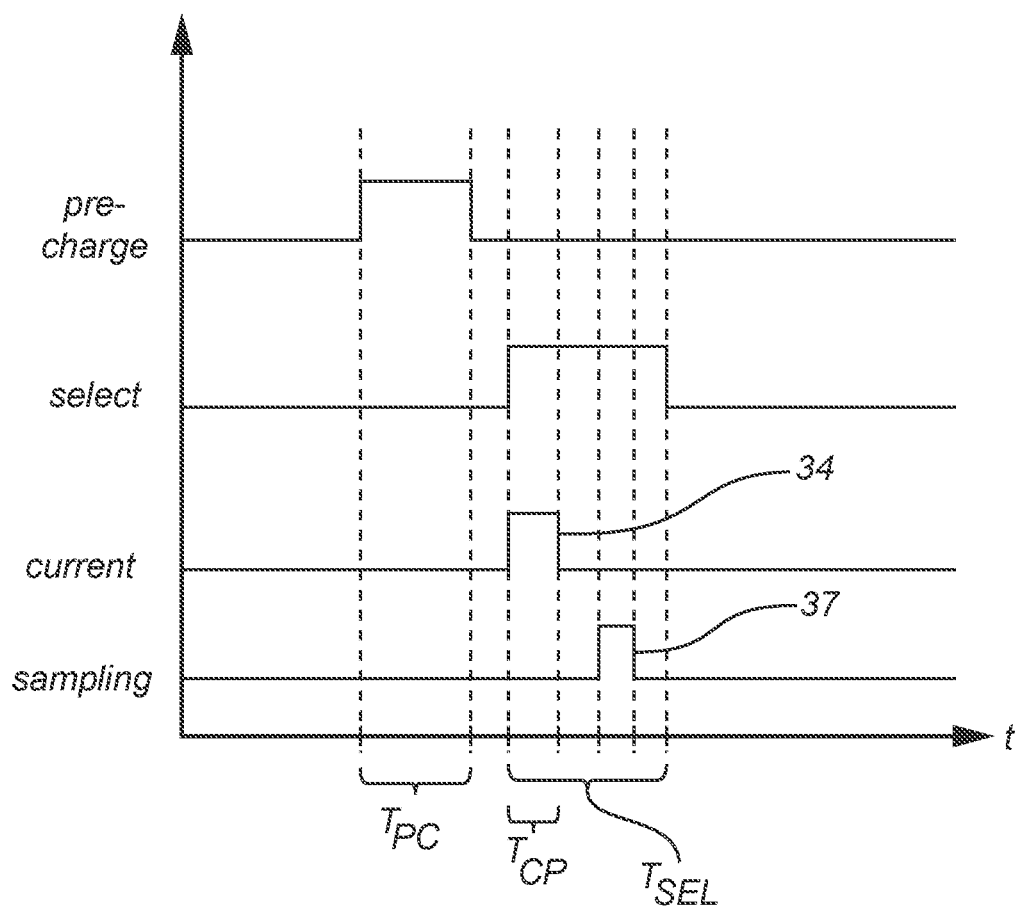
FIG. 5 is an exemplary timing diagram for the operation control circuitry comprised in the fingerprint sensing system according to an example embodiment of the present invention.

As is schematically illustrated in the exemplary timing diagram in FIG. 5, the start of the selection time duration $T_{sel}$ may advantageously be synchronized with the start of the current pulse time duration $T_{cp}$. For instance, as is shown in FIG. 5, the starts of the two periods may be substantially simultaneous. It should, however, be noted that simultaneous starts of the periods is not necessary, but that there may be a difference in timing, as long as the two time durations overlap. Simulations indicate that a near simultaneous start of the two time durations may be particularly beneficial. There are also indications that it may be particularly beneficial to use a longer time duration for the selection signal $S_{sel}$ than for the current pulse $T_{cp}$.

At a time when the potential of the read-out line 15 has settled on the sensing potential $V_{PX}$ that is indicative of the output of the sensing element 29, the potential of the read-out line 15 may be sampled by the read-out circuitry 23. This may, for example, be achieved by controlling the read-out circuitry 23 using the operation control circuitry 20 by providing a sampling control pulse 37 to the read-out circuitry 23, as is schematically indicated in FIG. 4 and FIG. 5.

As was mentioned further above, the provision of the current pulse 34 can reduce the time until the potential of the read-out line 15 can be accurately sampled (until the sampling pulse 37 can be provided), which may increase the read-out speed of the fingerprint sensing system 3. This may be particularly beneficial for embodiments in which the sensing signal providing element 31 comprises a field-effect transistor that is coupled to the sensing element 29 and to the read-out line 15, for example in a so-called source follower configuration.

Figure 6:
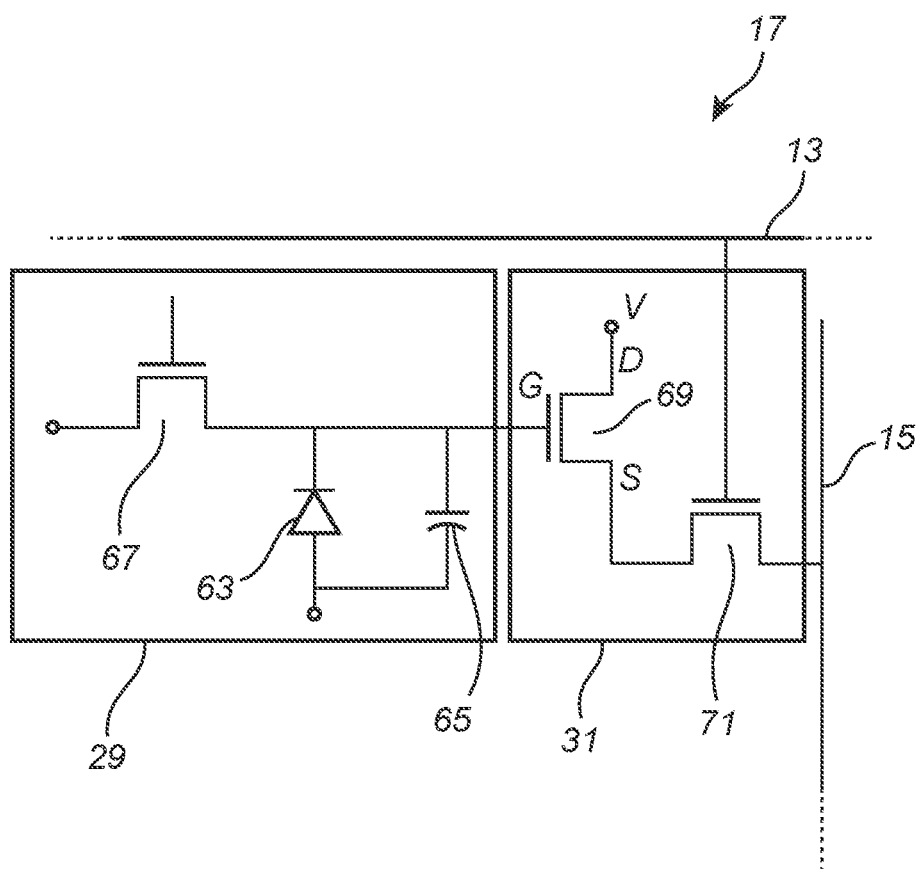
FIG. 6 schematically shows an example of a pixel element comprised in the fingerprint sensing system according to embodiments of the present invention, in the form of an optical pixel element.

An example of such an embodiment will now be described with reference to FIG. 6. FIG. 6 schematically shows an example of a pixel element 17 comprised in the fingerprint sensing system 3 according to embodiments of the present invention, in the form of an optical pixel element. It should, however, be noted that the configuration of the sensing signal providing element 29 described here is not dependent on the kind of physical property that is sensed by the sensing element 29.

In the exemplary optical pixel element 17 in FIG. 6, the sensing element 29 comprises a photo-diode 63, a pixel integrator 65, and a reset switch 67. The sensing signal providing circuitry 31 comprises a simple FET-based amplifier 69, in the form of a so-called source follower (or common drain stage), and a selection switch 71.

In operation, light incident on the photo-diode 63 results in a photo-current, which is provided to the pixel integrator 65 during an integration time to convert the accumulated photo-current to a voltage indicative of the amount of light incident on the photo-diode 63 during the integration time. This accumulated photo-current (and thus the voltage on the pixel integrator 65) is, at least to some degree, indicative of the distance between the photo-diode 63 and the finger surface.

The voltage output of the sensing element 29 controls the source follower 69 in the sensing signal providing element 31 to control the potential of the read-out line 15 to a sensing potential dependent on the voltage output of the sensing element 29, if the selection switch 71 is operated by a selection signal on the selection line 13. After a read-out event, the pixel element 17 is reset by providing a reset signal to the reset switch 67.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A fingerprint sensing system for sensing a finger surface of a finger, comprising:
   a plurality of conductive selection lines arranged in parallel to each other;
   a plurality of conductive read-out lines arranged in parallel to each other and crossing the selection lines;
   selection circuitry coupled to each selection line in the plurality of selection lines, and controllable to provide a selection signal on at least one selected selection line in the plurality of selection lines;
   current providing circuitry coupled to the read-out lines and controllable to generate a current in at least one of the read-out lines; and
   a plurality of pixel elements, each being formed at a respective intersection between a selection line in the plurality of selection lines and a read-out line in the plurality of read-out lines,
   each pixel element in the plurality of pixel elements comprising:
   a sensing element responsive to a property indicative of a distance between the sensing element and the finger surface to provide an output indicating a sensed value of the property; and
   a sensing signal providing element coupled to the sensing element, the selection line and the read-out line, the sensing signal providing element being configured to, in response to the selection signal being provided on the selection line, control the potential on the read-out line to a sensing potential being dependent on the output provided by the sensing element,
   wherein the fingerprint sensing system further comprises:
   operation control circuitry coupled to the selection circuitry and to the current providing circuitry, and configured to, for each pixel element in the plurality of pixel elements:
   provide a first control signal to the selection circuitry for controlling the selection circuitry to provide the selection signal on the selection line coupled to the sensing signal providing element of the pixel element; and
   provide a second control signal to the current providing circuitry to generate a current in the read-out line coupled to the sensing signal providing element of the pixel element.

2. The fingerprint sensing system according to claim 1, wherein the operation control circuitry is configured to provide the second control signal in synchronization with the first control signal.

3. The fingerprint sensing system according to claim 1, wherein:
   the first control signal results in the selection signal having a first time duration; and
   the second control signal results in at least a first current pulse having a second time duration, shorter than the first time duration.

4. The fingerprint sensing system according to claim 1, wherein the sensing signal providing element comprises a field-effect transistor coupled to the sensing element and to the read-out line.

5. The fingerprint sensing system according to claim 4, wherein the sensing element is coupled to a gate terminal of the field-effect transistor and the read-out line is coupled to a source terminal of the field-effect transistor.

6. The fingerprint sensing system according to claim 4, wherein the sensing element is coupled to a gate terminal of the field-effect transistor and the read-out line is coupled to a drain terminal of the field-effect transistor.

7. The fingerprint sensing system according to claim 1, further comprising:
   pre-charge potential providing circuitry coupled to the read-out lines and controllable to charge at least one of the read-out lines to a predefined pre-charge potential,
   wherein the operation control circuitry is coupled to the pre-charge potential circuitry and configured to, for each pixel element in the plurality of pixel elements:
   provide a third control signal to the pre-charge potential providing circuitry to control the read-out line coupled to the sensing signal providing element of the pixel element to the pre-charge potential.

8. The fingerprint sensing system according to claim 7, wherein the operation control circuitry is configured to provide the third control signal before the first control signal and the second control signal.

9. The fingerprint sensing system according to claim 7, wherein
   the sensing signal providing element is capable of controlling the potential on the read-out line to sensing potentials within a predefined sensing potential range from a minimum sensing potential to a maximum sensing potential; and
   the pre-charge potential is outside the sensing potential range, higher than 70% of the minimum sensing potential, and lower than 130% of the maximum sensing potential.

10. The fingerprint sensing system according to claim 1, wherein:
    the sensing element comprised in each pixel element in the plurality of pixel elements is responsive to an amount of light incident on the sensing element to provide an output indicating a sensed value of the amount of light.

11. The fingerprint sensing system according to claim 1, further comprising:
    read-out circuitry coupled to each read-out line in the plurality of read-out lines for acquiring the sensing potential via a read-out line connected to a selected pixel element.

12. An electronic device, comprising:
    the fingerprint sensing system according to claim 11; and
    processing circuitry coupled to the fingerprint sensing system, and configured to perform an authentication based read-out signals provided by the read-out circuitry of the fingerprint sensing system.

13. A method of operating a fingerprint sensing system comprising a plurality of conductive selection lines arranged in parallel to each other; a plurality of conductive read-out lines arranged in parallel to each other and crossing the selection lines; selection circuitry coupled to each selection line in the plurality of selection lines; current providing circuitry coupled to the read-out lines; and a plurality of pixel elements, each being formed at a respective intersection between a selection line in the plurality of selection lines and a read-out line in the plurality of read-out lines, each pixel element in the plurality of pixel elements comprising: a sensing element responsive to a property indicative of a distance between the sensing element and a finger surface to provide an output indicating a sensed value of the property; and a sensing signal providing element coupled to the sensing element, the selection line and the read-out line, the method comprising, for each pixel element in the plurality of pixel elements:
    a) controlling the selection circuitry to provide a selection signal on the selection line coupled to the sensing signal providing element of the pixel element; and b) controlling the current providing circuitry to generate a current in the read-out line coupled to the sensing signal providing element of the pixel element.

14. The method according to claim 13, further comprising for each pixel element in the plurality of pixel elements, before a) and b):
   c) controlling the read-out line coupled to the sensing signal providing element of the pixel element to a pre-defined pre-charge potential.

* * * * *